US009305664B2

(12) United States Patent
Pious et al.

(10) Patent No.: US 9,305,664 B2
(45) Date of Patent: Apr. 5, 2016

(54) MEMORY REPAIR CATEGORIZATION TRACKING

(71) Applicant: Texas Instruments Incorporated, Dallas, TX (US)

(72) Inventors: Beena Pious, Carrollton, TX (US); Stanton Petree Ashburn, McKinney, TX (US); Abha Singh Kasper, Fairview, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 73 days.

(21) Appl. No.: 14/226,700

(22) Filed: Mar. 26, 2014

(65) Prior Publication Data

US 2015/0279487 A1 Oct. 1, 2015

(51) Int. Cl.
| | |
|---|---|
| G11C 29/00 | (2006.01) |
| G11C 29/44 | (2006.01) |
| G11C 17/16 | (2006.01) |
| G11C 29/02 | (2006.01) |
| G11C 29/56 | (2006.01) |
| G11C 17/18 | (2006.01) |

(52) U.S. Cl.
CPC .............. *G11C 29/44* (2013.01); *G11C 17/16* (2013.01); *G11C 29/006* (2013.01); *G11C 29/027* (2013.01); *G11C 29/56008* (2013.01); *G11C 29/78* (2013.01); *G11C 17/18* (2013.01); *G11C 2029/4402* (2013.01); *G11C 2029/5604* (2013.01)

(58) Field of Classification Search
CPC ........ G11C 29/44; G11C 29/78; G11C 17/16; G11C 17/18
See application file for complete search history.

(56) References Cited

U.S. PATENT DOCUMENTS

| | | | |
|---|---|---|---|
| 5,126,973 A | 6/1992 | Gallia et al. | |
| 5,422,850 A | 6/1995 | Sukegawa et al. | |
| 5,984,190 A | 11/1999 | Nevill | |
| 6,097,645 A | 8/2000 | Penney et al. | |
| 8,542,545 B2 | 9/2013 | Loh et al. | |
| 2005/0149782 A1* | 7/2005 | McPartland | 714/718 |

OTHER PUBLICATIONS

William R. Tonti, "eFuse Design and Reliability", IEEE International Integrated Reliability Workshop Final Report, 2008, IRW 2008, Oct. 12-16, 2008, S. Lake Tahoe, CA, pp. 1-3, last modified Jun. 2008, available at http://paris.utdallas.edu/ssiri08/Tonti_SSIRI-eFuse_v2.pdf on Mar. 25, 2014.

"Wafer Testing", Wikipedia, pp. 1-3, available at http://en.wikipedia.org/wiki/Wafer_testing on Mar. 25, 2014.

* cited by examiner

*Primary Examiner* — Sam Rizk (74) *Attorney, Agent, or Firm* — Steven A. Shaw; Frank D. Cimino (57) ABSTRACT

An integrated circuit includes a set of non-volatile bits that may be programmed during multiprobe testing of the integrated circuit (IC). A defective portion of the IC is identified by testing the IC during multiprobe testing prior to packaging the IC. The IC is scrapped if the defective portion of IC does not meet repair criteria. A defect category is selected that is indicative of the defective portion, wherein the defect category is selected from a set of defect categories. The defective portion is replaced with a standby repair portion by modifying circuitry on the IC. The selected defect category is recorded in a plurality of non-volatile bits on the IC. The non-volatile bits may be read after extended testing or after end-user deployment in order to track failure rate of repaired ICs based on the defect category.

10 Claims, 5 Drawing Sheets

FIG. 4
C28nm REPAIRED CATEGORIES YIELD

MEMORY REPAIR CATEGORIZATION TRACKING

FIELD OF THE INVENTION

This invention generally relates to fabrication of integrated circuits, and in particular to tracking repaired chips.

BACKGROUND OF THE INVENTION

Typically, many identical integrated circuits are constructed on a single wafer of semiconductor material, such as silicon or gallium arsenide. The portion of the wafer occupied by a single one of the integrated circuits is called a die. After fabrication of the integrated circuits is completed, a series of tests is performed on the wafer in which a set of functional tests of each die is performed at a probe test station. The test data collected for each die is used in subsequent assembly/packaging steps to ensure that only properly functioning die are packaged as integrated circuit chips.

Following the probe test, the individual dies are separated from one another and each properly functioning die is encapsulated in a package to form a packaged die that is commonly referred to as an integrated circuit. Subsequently, a series of testing operations may be performed for each of the integrated circuits.

While semiconductor device manufacturing processes continue to improve, manufacturing induced defects can still occur. Such defects can arise from uncontrollable process variations or particulate contamination. For the most part, these defects are not catastrophic, and only give rise to a limited number of nonfunctional memory cells within a large memory array. To prevent such relatively small defects from destroying a memory device, it is common practice to employ "redundant" memory cells.

System on a Chip (SoC) devices typically include one or more memory arrays, each of which includes large number of memory cells arranged in rows and columns. The memory cells are accessed by the application of an address, which results in the selection of a row and a column (or a group of columns). Commonly, memory cells within the same row are coupled to a word line, while memory cells within the same column are coupled to a bit line (or bit line pair). In response to a row address, a given word line will be activated, coupling a row of memory cells to their respective bit line. In response to a column address, selected bit lines are coupled to an input/output (I/O) bus, allowing data to be read from, or written to, the selected memory cells.

Redundant memory cells are extra memory cells that can be used to replace defective memory cells. In this manner, a device can essentially repair itself by accessing the redundant memory cells instead of the defective memory cells. A redundancy scheme can include row-wise redundancy and/or column-wise redundancy. In the case of row-wise redundancy, one or more extra rows of memory cells are created within the array. In the event an applied memory address corresponds to a row having a defective memory cell, one of the extra rows of memory cells is accessed in place of the row containing the defective memory cell. In the case of column-wise redundancy, the extra columns of memory cells are created within the array. In a memory access operation, the bit line associated with the extra column is coupled to an I/O bus in place of the bit line of a column having defective memory cells.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

While semiconductor device manufacturing processes continue to improve, manufacturing induced defects can still occur. Such defects can arise from uncontrollable process variations or particulate contamination. For the most part, these defects are not catastrophic, and only give rise to a limited number of nonfunctional memory cells within an array. To prevent such relatively small defects from destroying a memory device, it is common practice to employ "redundant" memory cells. However, it has been determined that repaired units may be more susceptible to failures at customer sites. For this reason, a manufacturer may be reluctant to ship repaired parts to a customer for use in critical applications.

Embodiments of the invention provide a technique to enable tracking of "soft" vs. "hard" repair categories utilizing a die identification block (die ID) present on each die that may be encoded with pre-defined categories for soft and hard repair. For example, a hard repaired device may have failed all voltage corners while a soft repaired device may have failed only a few voltage corners. This allows repaired devices to be tracked during EFR (Early Failure Rate) and HTOL (High Temperature Operating Life) testing following fabrication and packaging. It also allows tracking of repaired devices returned from customer use. Analysis of repaired devices that experience a subsequent failure may allow for adjustment of probe test criteria for deciding which die are repairable, for example.

As technology scales to provide more and more complexity in circuit designs, it becomes critical to enable memory repair for critical applications, such as automotive/industrial products, for example. As such, the tracking technique described herein enables characterization of soft categories of repair to enable further reduction of defects parts per million (dppm). Implementation of repair category tracking enables quick and efficient screening of unreliable parts Embodiments may use a test scheme for identifying the repair category using multi-binning test methods and blowing efuses at multi-probe test, thus providing a tool for tracking each unit to the lowest repair granularity level. The scheme may involve the following steps. First, normal SRAM (static random access memory) functional tests are performed using test screens and redundancy calculations. If the unit is repairable, multi-binning test methods may be used to categorize hard and soft repair based on voltage corners failed and pre-defined categories that can be defined by the product/test team. Finally, efuse bits may be blown to track hard repair, soft repair, and binning. In some embodiments, the efuses may be part of the die ID block that is provided on every die of a wafer. The memory repair tracking scheme will be described in more detail below.

Figure 1:
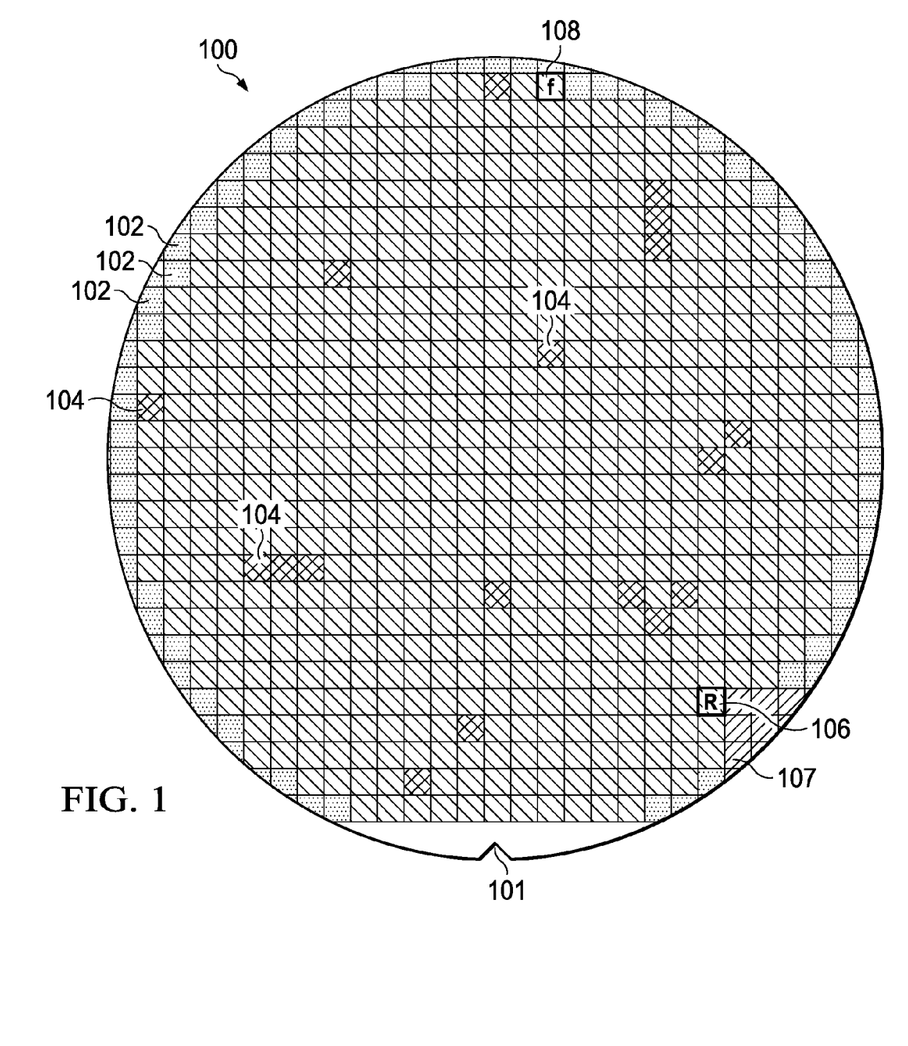
FIG. 1 illustrates an example semiconductor wafer.

FIG. 1 shows an example of a typical semiconductor wafer, where the constituent dice are illustrated as adjacent rectangular shapes in a two-dimensional array of the wafer, but are not shown to actual scale. Larger wafers that are now available may contain hundreds or thousands of die, depending on the size of the die and the size of the wafer. For example, a typical wafer may range in size from a few inches in diameter to twelve inches (300 mm) or more in diameter. A wafer typically contains an orientation marker 101 in the form of a wafer notch. Other examples of orientation markers include a wafer flat, a wafer notch, or similar feature.

A suitable reference feature, e.g., a mirror area, non-circuit die, or other feature that is readily distinguishable visually from an integrated circuit die, is located in a predetermined area of the wafer. In the example of FIG. 1, the reference feature is a mirror die area 107 that occupies an area adjacent a lower right edge of the wafer, close to the flat edge orientation marker. A reference die 106 is located leftward adjacent the mirror die area 107 as shown in the FIG. 1. A coordinate system of the wafer map is defined relative to the location of the reference die on the wafer. The spatial relationship between the reference die and the reference feature is known. The reference feature is readily identifiable by its visually distinct appearance and its known spatial relationship to the wafer notch orientation marker. In conventional full wafer processing, the probe station and assembly/test (A/T) facility equipment uses the reference feature to identify the reference die.

Around the edge of wafer 100 are edge die 102 that are not usable and will be discarded. There may also be a number of die that were determined to be defective by the wafer probe process. In this example wafer a set of defective die are shown as shaded blocks, as indicated generally at 104. The die map generated during wafer probe contains the location of all defective and edge die. Obviously, the location of the defective die may be different on each wafer.

While not shown in this figure, each die may contain a die ID block of non-volatile memory bits. The non-volatile bits may be various types of fuses that can be programmed by laser or by voltage pulses, for example. Silicon based electrically programmed fuses (efuse) are well known; see for example "eFuse Design and Reliability" William Tonti, 2008. In other embodiments, the die ID may be non-volatile memory bits, such as programmable read only memory (PROM), erasable PROM (EPROM), flash memory, ferroelectric random access memory (FRAM), etc., for example.

The die ID block on each die may be programmed at probe test to provide an identification number for each die. In a similar manner, if the die is repaired, the type of repair may be encoded in a set of efuse bits in the die ID block, as will be described in more detail below.

Conventional assembly processes such as pick and place use an electronic wafer map that includes information indicative of die attributes such as the exact location of each die on the wafer, and wafer-level probe test results for each die. The wafer map identifies the exact location of each die using a coordinate system that corresponds to the physical structure of the wafer. The probe test results (die quality) may be expressed as a single bit value, e.g., good (accept) or bad (reject), or a multiple bit value that provides additional information such as good first grade, good second grade, etc. The wafer map includes a plurality of bin numbers to categorize various attributes and/or properties of each die. For example, bin 1 may contain identification of all good first grade dice, bin 2 may contain identification of all good second grade dice, bin 3 may contain identification of all plug dice, bin 4 may contain identification of all bad dice, and bin 5 may contain identification of all edge bad dice. Each die may be assigned to a particular bin based on the results of the probe testing.

A wafer map host system receives the map data, provides storage, and enables data download into the production equipment to support processing of wafers to manufacture a semiconductor product. The wafer map host system transforms the lot's wafer map file into a suitable map file for the pick and place equipment to handle and prepares them for equipment download. On the manufacturing floor, as the wafer goes through the assembly process, a barcode may be generated for the wafer identification (ID) and may be attached to the wafer or to a carrier frame. When the wafer is ready to be processed at the pick and place equipment, the frame or wafer ID barcode is scanned and is used to request the wafer map from the wafer map host system. The pick and place equipment uses the downloaded wafer map to directly step to the good chips for pick-up.

At an Assembly/Test (A/T) facility, a wafer undergoes sawing to singulate the dice, and pick and place processing based on the wafer map. A wafer map, which specifies the exact location of all good dice, is used to control an accept/reject function of a typical pick and place system. The Die Attach assembly process depends on automated equipment following a wafer map perfectly to attach only Good Electrical Chips (GEC) to lead frames.

Figure 2:
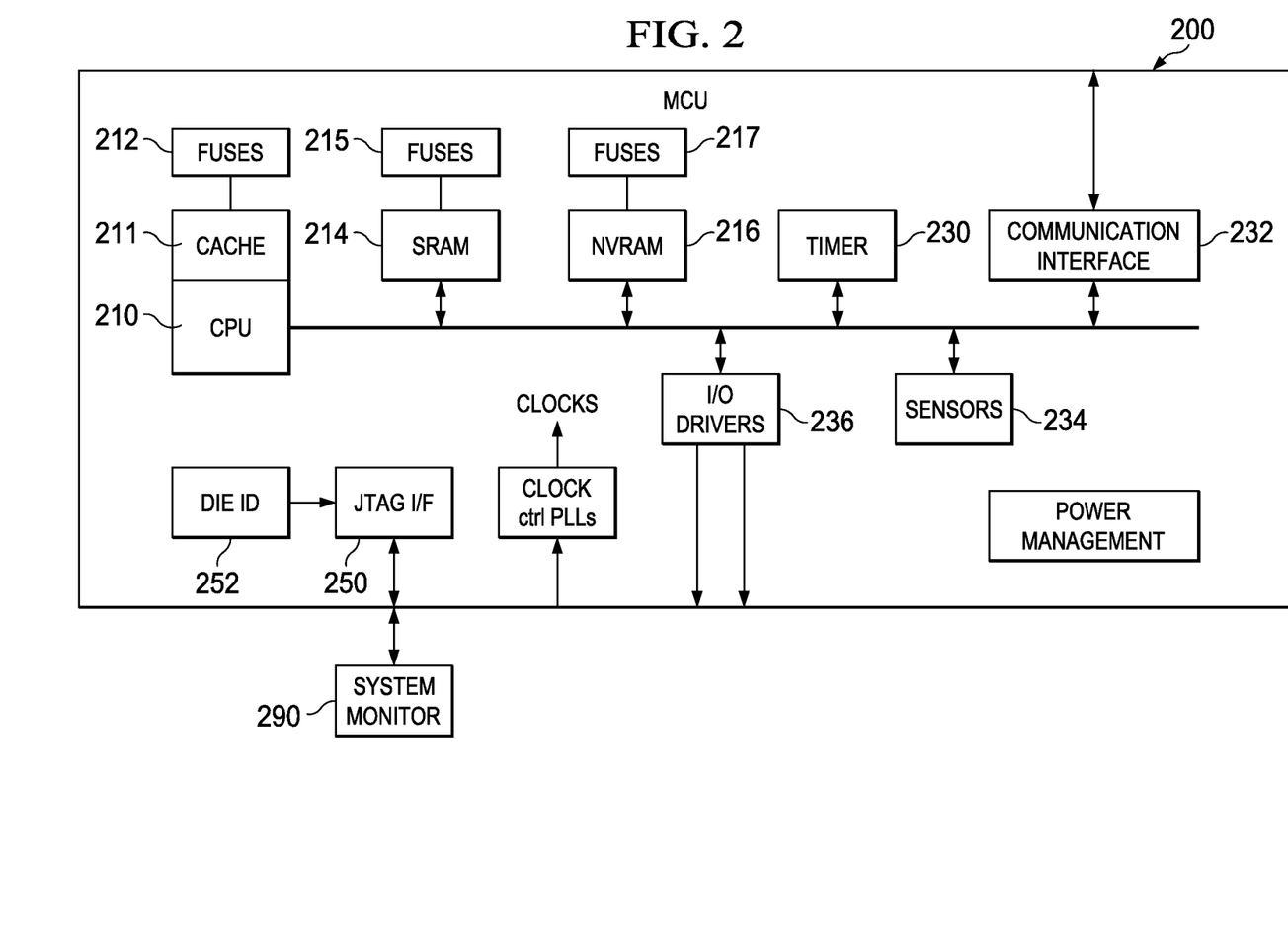
FIG. 2 is a block diagram of an example system on a chip contained in each die of the wafer of FIG. 1.

FIG. 2 is a block diagram of an example system on a chip (SoC) 200 contained in each die of the wafer of FIG. 1. SoC 200 may include one or more micro-control units (MCU) that may include a non-volatile storage module 216, a static random access memory 214, one or more timer modules 230, one or more sensors 234, input/output drivers 236, etc., for example. In some embodiments, SoC 200 may also include a communications interface 232 to allow wired or wireless communication, for example. The general operation and function of SoCs with one or more processors and memory are well known and need not be described in further detail herein.

SoC 200 may also include one or more processing units 210 that may execute software instructions stored in cache RAM 211 and also in SRAM 214 and non-volatile RAM 216, for example. As discussed above, large memory blocks such as cache 211, RAM 214 and even non-volatile RAM 216 may have a defective portion that may be discovered during probe testing after fabrication. Techniques now known or later developed may be used to repair a block of memory. One or more sets of fuses, such as fuses 212, 215, 217 may be provided to implement memory row or column replacement, for example.

Figure 3:
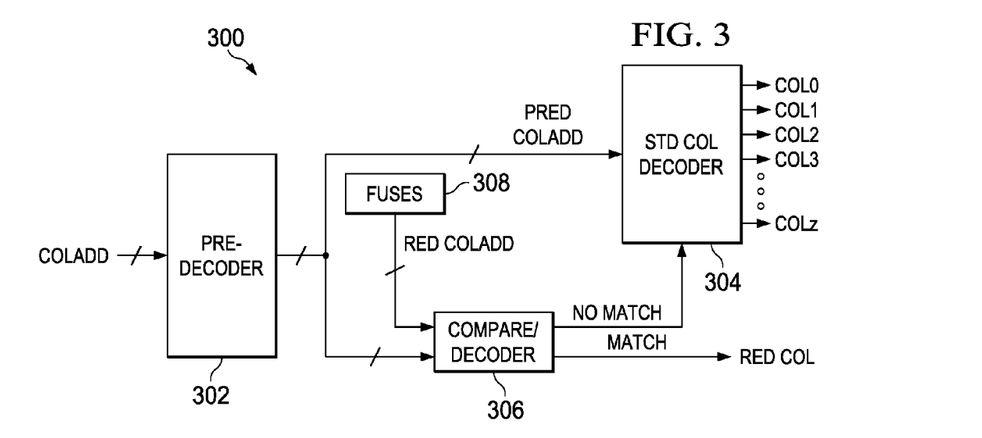
FIG. 3 is a block diagram illustrating repair decoding circuitry.

With current technologies such as 28 nm, an SoC can contain greater than 1000 instances of SRAM memory with total repairable memory sizes up to 90 Mb (Megabit). With such large memory sizes, shipment of repaired units becomes increasingly important. However, it may be necessary for reliability reasons to not ship certain categories of repaired SOCs. Implementation of repair category tracking enables quick and efficient screening of unreliable parts FIG. 3 is a block diagram illustrating repair decoding circuitry 300 that may be included with one or more of memory blocks 211, 214, 216, for example. To access selected bit lines within a memory cell array, a semiconductor memory device usually includes a column decoding circuit. The column decoding circuit receives the column address, and activates a particular column select signal according to the values of the column address. For example, in the event the column address includes 8-bits, the column decoder would activate one out of $2^8$ column select signals. The speed at which the column decoder can select a given column address (i.e., decode the address) can play an important role in the overall speed of the device.

When column redundancy schemes are employed, the semiconductor memory device must incorporate column redundancy circuits into the column decoding scheme. A common circuit item for such redundancy schemes is a redundancy decoder circuit for comparing the incoming column address with a known bad address (address of a column having a defective cell or cells). If a match occurs, the semiconductor memory device accesses a redundant column instead of the known bad column. The location of a defective column address is determined by testing the device after it has been manufactured, and then programming defective address location(s), often by way of fusible links or like, into the decoder circuit.

Decoding circuitry 300 includes a pre-decoder circuit 302 that receives a column address. The pre-decoder circuit 302 provides an initial level of decoding to generate "column factors." Such pre-decoding typically consists of an initial set of logic gates to combine groups of address bits with one another. The output of the pre-decoder circuit 302 is shown as "PRED COLADD." Typically, the number of PRED COLADD signals is greater than the number of COLADD signal lines.

The PRED COLADD signals are applied to a standard column decoder 304 and a compare/decoder circuit 306. In addition to the PRED COLADD signals, the compare/decoder circuit 306 also receives a pre-decoded defective column address RED COLADD. The RED COLADD address is provided by a fuse circuit 308. The fuse circuit 308 includes a fusible link corresponding to each RED COLADD signal. In order to generate the RED COLADD signal, selected of the fusible links within the fuse circuit 310 are either opened, or kept intact, to establish the logic of the RED COLADD signals.

When the RED COLADD signals do not match the PRED COLADD signals, a "no match" signal is activated which enables the standard column decoder 304. The standard column decoder 304 will then activate a standard column select signal (COL0-COLz) corresponding to the PRED COLADD signal. In contrast, when the RED COLADD signals match the PRED COLADD signals, a "match" signal is activated. The match signal serves as a redundant column enable signal RED COL. Various techniques for memory repair are well known, for example see U.S. Pat. No. 6,097,645, "High Speed Column Redundancy Scheme," Daniel Penney, et al.

Another technique for repairing soft failures in memory is described in U.S. Pat. No. 8,542,545 "Repairing Soft Failures in Memory Cells in SRAM Arrays," Wah Kit Loh and Beena Pious. In this technique, the SRAM array is tested to determine the location and type of soft failures in the memory cells. An assist circuit is activated that changes a voltage in a group of memory cells with the same type of soft failure. The change in voltage created by the assist circuit repairs the soft failures in the group. The group may be a word line or a bit line. The type of soft failures includes a failure during a read of a memory cell and a failure during the write of a memory cell.

During multiprobe test, each die typically goes through SRAM testing using one or more voltage levels, referred to as voltage corners. For example, the die may be tested at a nominal operating voltage (VsNom), a low operating voltage (VsLO), and a high operating voltage (VsHI). Depending on the type of memory and preferred test procedures, additional voltage corners may be tested.

Depending on the cumulative failures detected during the probe test, a redundancy solution may be calculated and a determination made as to whether the unit can be repaired or not. If the unit is repaired, a repair category code may be blown in the die ID block to show that it is repaired. Embodiments of the invention may use multi-binning and a code to indicate whether a die is a hard repair unit or a soft repair unit based on categories of repair corners defined by the product/test engineer. In an example 28 nm process, six voltage corners are tested. In this example, if the die is defective but repairable at all repair corners it may be categorized hard repaired die. If it fails any of the Vsramnom (nominal), Vsramoph (operational high +10% of nominal), or Vsramhi (high) corners, then it may be categorized as a "soft_hard" repaired die. If it fails any of the Vsramopl (operational low −10% of nominal), Vsramscn (Vmin screen condition for DISTURB fails), or Vsramlo (Vmin screen condition for WRITE fails) corners, then it may be categorized as a "soft_soft" repaired die, for example. Table 1 illustrates the category coding schemes used in this example; however, different schemes may be used in other embodiments that may include more or fewer categories, more or fewer test corners, etc., for example. In some embodiments, there may be a provision to store a different repair category code for different blocks on RAM contained on the die, for example.

TABLE 1

RAM repair categories

| Order | Repaired Type | Vsramscn | Vsramlo | Vsramopl | Vsramnom | Vsramoph | Vsramhi | |
|---|---|---|---|---|---|---|---|---|
| 1 | Hard | R | R | R | R | R | R | AND |
| 2 | Soft_Hard | x | x | x | R | R | R | OR |
| 3 | Soft_Soft | R | R | R | x | x | x | OR | order:
first check for Hard
if not Soft_Hard
if not Soft_Soft
x = don't care
R = Repaired
OR = any repaired
AND = all must be repaired The "soft_soft" category is typically transistor targeting fails which are not typically a reliability concern. The "hard" and "soft_hard" categories are more typically related to physical defects and potential reliability problems that may require further test screens in the future as more data is analyzed and understood.

Referring back to FIG. 2, die ID block 252 is a block of efuses that is present on every die of wafer 100 that may be programmed during multiprobe testing. The die ID block may be arranged as several rows of multiple bits, for example. In this embodiment, die ID block 252 is coupled JTAG module 250 that allows the die ID block contents to be scanned using the JTAG interface. JTAG (Joint Test Action Group) is the common name for what was later standardized as the IEEE 1149.1 It is a well known scheme that includes a standardized test access port and boundary scan logic within SoC 200. JTAG is typically used as the primary means of accessing sub-blocks of integrated circuits, making it a useful mechanism for debugging embedded systems which may not support any other debug-capable communications channel. JTAG module 250 provides a communication channel between SoC 200 and an external system monitor 290 after the die is packaged, for example. In another embodiment, these repair category bits may be viewed though other types of test ports. They may be viewed directly via the test port actions or by memory accesses generated via a test port, for example.

In this example, die ID 252 contains 128 efuse "bits" with 4 rows of 32 bits each referred to as rows 20,21,22,23. In this example, three bits of the die ID in row 20 are allocated for the repair category code, as illustrated in Table 2. In this example, bits 25, 24 are blown for hard repaired, Bits 24 only is blown for soft_hard repaired, and Bit 23 only is blown for soft_soft repaired.

TABLE 2 example Die ID bit assignments for repair categories
Die Id Row 20

| Repaired Category | Bit 25 | Bit 24 | Bit 23 |
| --- | --- | --- | --- |
| Hard | 1 | 1 | 0 |
| Soft_Hard | 0 | 1 | 0 |
| Soft_Soft | 0 | 0 | 1 |

Once the tracking bits are blown, the repair category of each unit may be traced at all the subsequent test points including Final Test, EFR, and HTOL, for example, by simply reading the blown efuse bits via the JTAG interface. Based on the results, failing categories can be screened by simply modifying thresholds for good unit categories at probe.

Figure 4:
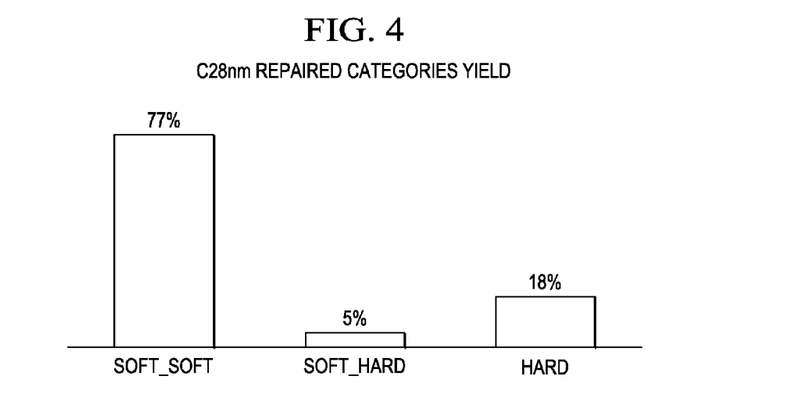
FIG. 4 is a bar chart illustrating repair categories yield.

FIG. 4 is a bar chart illustrating repair categories yield for an example die fabricated in a 28 nm process. Reliability may be improved by implementing the repair tracking method described herein. Assuming that the Hard_Hard and Soft_Hard categories are reliability issues, then in this example an estimated 23% reduction in unreliable parts of the repaired units may result if these categories are screened. Of course, these rates may change as the process becomes more mature.

This method saves time when screening is determined to be needed, as it would only require stopping shipment of specific categories. Since data may be collected from the beginning of a production run, no wait for implementation of tests, data collection, screen development, etc. is needed.

Figure 5:
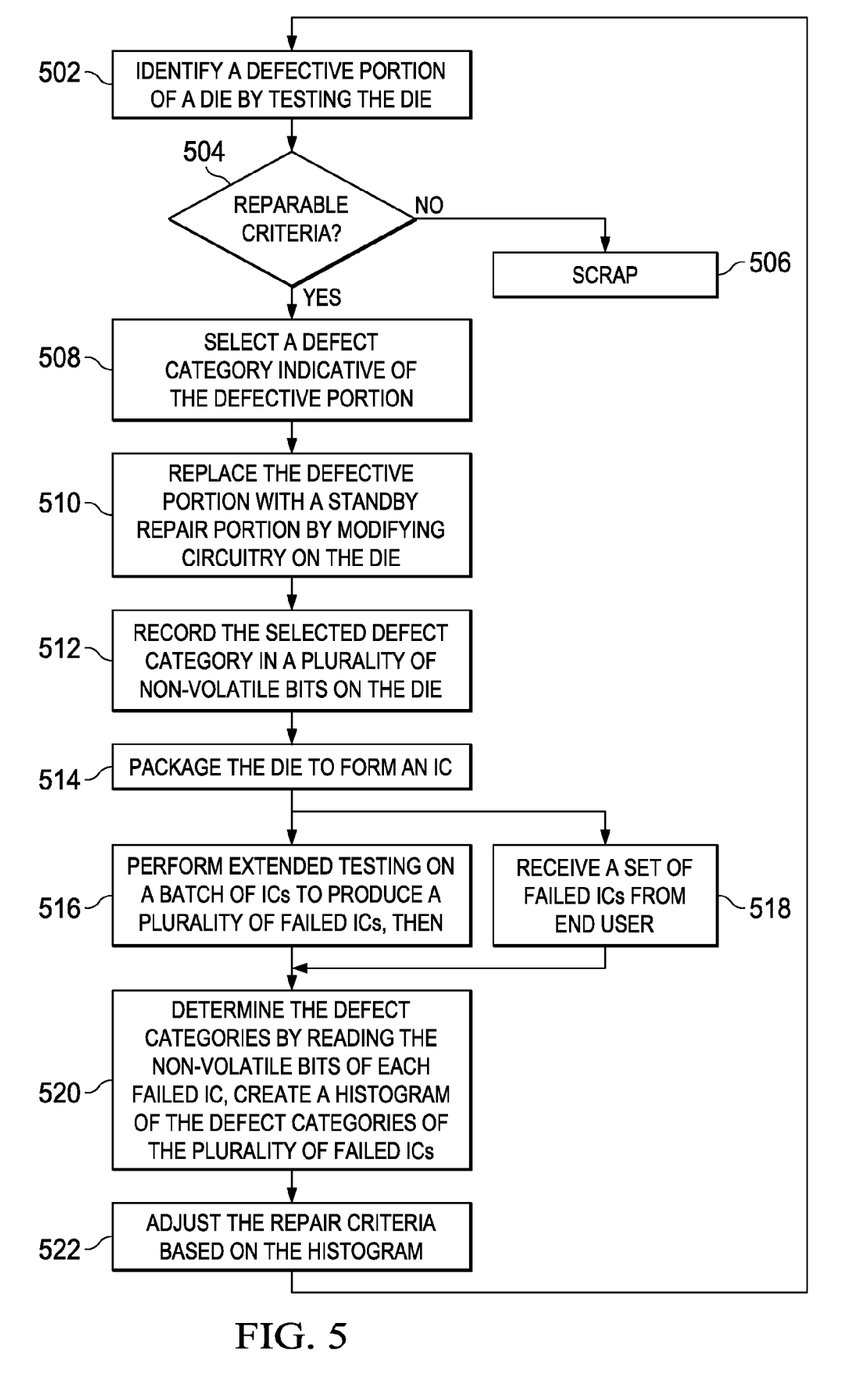
FIG. 5 is a flow diagram illustrating testing and repair categorization of a die at probe test.

FIG. 5 is a flow diagram illustrating testing and repair categorization of a die at multiprobe test. After wafer fabrication, the wafer may be probe tested at a multiprobe station to test each die on the wafer. As described above in more detail, a defective portion of a die may be identified 502 during the mulitprobe wafer testing.

For each detected defective portion of the die a set of repair criteria may be used to determine 504 if the defective portion meets a repair criteria. If not, the die is tagged for scrapping 506. A die that is to be scrapped may be indicated on a wafer map for the wafer under test, for example, and then sorted to a scrap bin after the wafer is divided in separate die.

A defect category is selected 508 that is indicative of the type of defect that was detected. The defect category may be selected from a set of defect categories. A set of defect criteria are established to define each defect category, as described in more detail above. For example, a set of defect categories may be defined according to Table 1.

The defective portion of a repairable die is replaced 510 with a standby repair portion by modifying circuitry on the IC, as described above in more detail. Typically, this is done by blowing one or more fuses that control a row or column decoder for a block of memory, for example.

The selected defect category is then recorded 512 in a plurality of non-volatile bits on the IC. As described above, the non-volatile bits may be efuses, for example. The repair criteria may be recorded using a code, such as illustrated in Table 2, for example.

After the wafer is scribed or sawn to separate the die and the individual die are packaged 514, they may be further tested to perform 516 extended reliability testing on a batch of ICs. Typically, extended testing may produce a set of failed ICs. The defect categories of the set of failed ICs may then be determined 520 by reading the non-volatile bits of each of the plurality of failed ICs. This may be done by coupling the JTAG interface of each packaged IC to a monitor system, for example. A histogram of the defect categories of the set of failed ICs may then be created 520. The histogram may be similar to FIG. 4, for example. Based on the number of ICs in each defect category that failed the extended testing after being repaired, the repair criteria may be adjusted 522 based on the histogram. In this manner, the reliability of subsequent wafer lots may be improved.

In a similar manner, a set of ICs that are returned 518 after use in end-user equipment may be analyzed. The defect categories of the set of failed ICs may then be determined 520 by reading the non-volatile bits of each of the set of failed ICs. This may be done by coupling the JTAG interface of each packaged IC to a monitor system, for example. A histogram of the defect categories of the set of failed ICs may then be created 520. The histogram may be similar to FIG. 4, for example. Based on the number of ICs in each defect category that failed the extended testing after being repaired, the repair criteria may be adjusted 522 based on the histogram. In this manner, the reliability of subsequent wafer lots may be improved.

Figure 6:
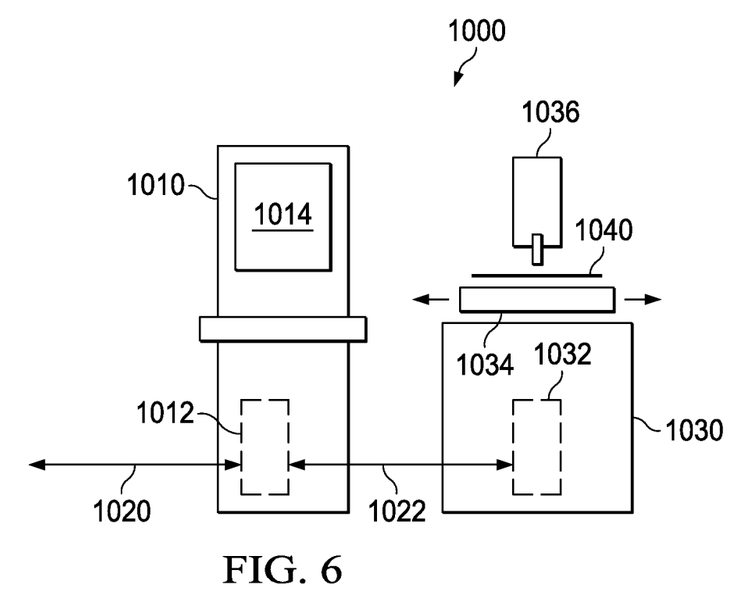
FIG. 6 is an illustration of an example probe test station.

FIG. 6 is an illustration of an example multiprobe test station 1000 that may perform the probe test process of FIG. 5. Multiprobe station 1000 is representative of many currently available and well known or later developed multiprobe facilities, and therefore need not be described in detail herein. However, multiprobe facility 1000 will now be described briefly to aid in understanding embodiments of the invention.

Multiprobe station 1030 supports a wafer table 1034 that is servo-controlled to move in a two dimensional manner with respect to multiprobe assembly 1036. A wafer 104 that is to be tested is placed on wafer table 1034 and moves with it. Multiprobe assembly 1036 is servo-controlled to probe each die from a wafer 1040 as the wafer is indexed to position by wafer table 1034. Multiprobe station 1030 may contain control logic 1032 that is operable to control the servo mechanisms.

Control station 1010 may provide an interface for a human operator and may contain a display 1014 along with other interface devices needed by an operator to control multiprobe station 1030, such as a keyboard, a joystick, or similar interface for manually controlling wafer table 1034, actuator buttons, etc, for example. Control station 1010 may contain control electronics 1012 that provide control functions for multiprobe facility 1000.

Control electronics 1012 may be coupled to control logic 1032 via cable 1022. Control electronics 1012 may also be coupled to other data systems in the production plant via local or wide area network connection 1020. Control electronics 1012 and control logic 1032 may be located in separate cabinets, as illustrated, or may be implemented in a single cabinet local to multiprobe station 1030 or may be remotely located in another part of the production facility, for example.

As mentioned earlier, a multiprobe facility, such as multiprobe facility 1000, may be loaded with a wafer 1040 that then undergoes multiprobe testing of the wafer based on a wafer map for wafer 1040, as described above. The wafer map is updated during multiprobing to specify the exact location of all good dice and is used to control an accept/reject function of a pick and place (P/P) station. A wafer map is a set of information that is used by process equipment when handling a wafer at its workstation. The map data includes the coordinates of each die on a wafer, bin assignments for good dies and reject dies, wafer orientation or rotation, and the wafer identification that is used to associate the wafer map with the physical wafer, for example The wafer prober may exercise test circuitry on the wafer scribe lines. When all test patterns pass for a specific die, its position is remembered for later use during IC packaging. As discussed above, a die may have internal spare resources available for repairing various memory structures, such as RAM, flash memory, etc. If it does not pass some test patterns these spare resources can be used. As described above in more detail, when a defective die is repaired at probe station 1030, a defect code is programmed into a set of non-volatile bits on the die to allow the defect category to be determined after the die has been packaged and subjected to further testing and/or use in end-user equipment. If redundancy of failed die is not possible the die is considered faulty and is discarded.

The wafer map host system, located in the production facility, receives the map data, provides storage, and enables data download into the production equipment to support processing of wafers to manufacture a semiconductor product. The wafer map host system transforms the lot's wafer map file into a suitable map file for the pick and place equipment to handle and prepares them for equipment download. In the manufacturing floor, as the wafer goes through the assembly process, a barcode may be generated for the wafer identification (ID) and is attached to the wafer or to a carrier frame. When the wafer is ready to be processed at the pick and place equipment, the frame or wafer ID barcode is scanned and is used to request the wafer map from the wafer map host system. A P/P station uses the downloaded wafer map to step to the good chips for pick-up.

Each wafer 1040 contains a plurality of integrated circuit die. The wafer map identifies the exact location of each die using a coordinate system that corresponds to the physical structure of the wafer. The probe test results (die quality) may be expressed as a single bit value, e.g., good (accept) or bad (reject), or a multiple bit value that provides additional information such as good first grade, good second grade, etc. The wafer map includes a plurality of bin numbers to categorize various attributes and/or properties of each die. For example, bin 1 may contain identification of all good first grade dice, bin 2 may contain identification of all good second grade dice, bin 3 may contain identification of all plug dice, bin 4 may contain identification of all bad dice, and bin 5 may contain identification of all edge bad dice. Each die may be assigned to a particular bin based on the results of the probe testing.

Other Embodiments

While the invention has been described with reference to illustrative embodiments, this description is not intended to be construed in a limiting sense. Various other embodiments of the invention will be apparent to persons skilled in the art upon reference to this description. For example, while storage of a defect code may be done in a die ID structure on a die, as described herein, in other embodiments a defect code may be stored in other non-volatile memory structures, such as programmable read only memory (PROM), erasable PROM (EPROM), flash memory, ferro-electric random access memory (FRAM), etc., for example. In another embodiment, the non-volatile bits may be various types of fuses that can be programmed by laser or by voltage pulses, for example.

While three defect categories were described herein, (hard, soft-hard, and soft-soft) other embodiments may use fewer or additional defect categories.

In an embodiment that has multiple blocks of memory, a defect category code for each memory block may be recorded, for example.

While the repair of a memory array using redundant columns or rows was described herein, other embodiments may provide defect tracking for other types of repair, such as: replacement of a block of logic with a spare block of logic, replacement of a defective CPU core with a spare CPU core, etc., for example.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the preceding discussion and in the claims, the terms "including" and "comprising" are used in an open-ended fashion, and thus should be interpreted to mean "including, but not limited to . . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for tracking repairs on an integrated circuit, the method comprising:
   identifying a defective portion of an integrated circuit die by testing the die at a wafer probe station;
   determining that the defective portion meets a repair criteria, otherwise scrapping the die;
   selecting a defect category indicative of the defective portion, wherein the defect category is selected from a set of defect categories;
   replacing the defective portion with a standby repair portion by modifying circuitry on the die;
   recording the selected defect category in a plurality of non-volatile bits on the die; and
   packaging the die to form the IC.

2. The method of claim 1, wherein the non-volatile bits are electronic fuses.

3. The method of claim 1, wherein the defective portion is a set of memory bits.

4. The method of claim 1, further comprising determining the defect categories of a plurality of failed ICs that have been returned from deployment in end-user equipment by reading the non-volatile bits of each of the plurality of failed ICs.

5. The method of claim 4, further comprising:
   creating a histogram of the defect categories of the plurality of failed ICs; and
   adjusting the repair criteria based on the histogram.

6. The method of claim 1, further comprising:
   performing extended reliability testing on a batch of ICs to produce a plurality of failed ICs; and
   determining the defect categories of the plurality of failed ICs by reading the non-volatile bits of each of the plurality of failed ICs.

7. The method of claim 6, further comprising:
   creating a histogram of the defect categories of the plurality of failed ICs; and
   adjusting the repair criteria based on the histogram.

8. The method of claim 6, wherein the non-volatile bits are read by a monitoring system via a JTAG interface coupled to each of the plurality of ICs.

9. An integrated circuit, comprising:
   a die having a substrate with circuitry formed thereon, encapsulated within a package;
   redundant circuitry formed on the substrate with replacement circuitry configured for selection to replace a portion of the circuitry for repair of the die;
   a set of non-volatile bits coupled to a test interface, wherein the test interface is accessible by an external monitoring system; and
   wherein the set of non-volatile bits were programmed with a defect code during multiprobe testing of the die prior to being encapsulated to indicate a category of defect that was repaired by selecting the redundant circuitry.

10. The integrated circuit of claim 9, wherein the test interface is a JTAG interface.

* * * * *